United States Patent
Shieh et al.

(10) Patent No.: US 9,420,292 B2
(45) Date of Patent: Aug. 16, 2016

(54) CONTENT ADAPTIVE COMPRESSION SYSTEM

(71) Applicants: NCKU Research and Development Foundation, Tainan (TW); Himax Technologies Limited, Tainan (TW)

(72) Inventors: Ming-Der Shieh, Tainan (TW); Chun-Wei Chen, Tainan (TW); Der-Wei Yang, Tainan (TW); Chia-Cheng Lo, Tainan (TW); Tzung-Ren Wang, Tainan (TW)

(73) Assignees: NCKU Research and Development Foundation, Tainan (TW); Himax Technologies Limited, Tainan (TW)

( * ) Notice: Subject to any disclaimer, the term of this patent is extended or adjusted under 35 U.S.C. 154(b) by 86 days.

(21) Appl. No.: 14/565,324

(22) Filed: Dec. 9, 2014

(65) Prior Publication Data
US 2016/0165231 A1 Jun. 9, 2016

(51) Int. Cl.
| | | |
|---|---|---|
| *G06K 9/36* | (2006.01) | |
| *H04N 19/105* | (2014.01) | |
| *H04N 19/117* | (2014.01) | |
| *H04N 19/119* | (2014.01) | |
| *H04N 19/172* | (2014.01) | |
| *H04N 19/177* | (2014.01) | |
| *H04N 19/182* | (2014.01) | |
| *H04N 19/186* | (2014.01) | |
| *G06T 9/00* | (2006.01) | |
| *G06F 11/10* | (2006.01) | |
| *H04N 19/166* | (2014.01) | |
| *H04N 19/13* | (2014.01) | |
| *G06T 9/20* | (2006.01) | |
| *G06T 7/40* | (2006.01) | |

(52) U.S. Cl.
CPC .......... *H04N 19/105* (2014.11); *G06F 11/1012* (2013.01); *G06T 7/408* (2013.01); *G06T 9/00* (2013.01); *G06T 9/20* (2013.01); *H04N 19/117* (2014.11); *H04N 19/119* (2014.11); *H04N 19/13* (2014.11); *H04N 19/166* (2014.11); *H04N 19/172* (2014.11); *H04N 19/177* (2014.11); *H04N 19/182* (2014.11); *H04N 19/186* (2014.11); *G06T 2207/10024* (2013.01)

(58) Field of Classification Search
CPC ....... H04N 7/26244; H04N 7/30; H04N 7/50; H04N 7/26127; H04N 7/26271; H03M 7/3046; H03M 7/3051; H03M 7/3084
See application file for complete search history.

(56) References Cited

U.S. PATENT DOCUMENTS

| | | | | |
|---|---|---|---|---|
| 7,813,564 B2 * | 10/2010 | Jones | ................... | H04N 19/147 382/232 |
| 2007/0005795 A1 * | 1/2007 | Gonzalez | .......... | G06F 17/30017 709/232 |

* cited by examiner

*Primary Examiner* — Duy M Dang

(74) *Attorney, Agent, or Firm* — Donald E. Stout; Stout, Uxa & Buyan, LLP

(57) ABSTRACT

A content adaptive compression system includes a plurality of encoders being coupled to receive a portion of an image, and accordingly generating candidate compressed codes, respectively, the plurality of encoders being configured for encoding images of different contents. An error count unit is configured to determine an amount of error between the image and the candidate compressed code for each of the encoders. A mode decision unit is coupled to receive a plurality of the amount of error, the candidate compressed code associated with least amount of error being outputted as an adaptive compressed code for the image.

13 Claims, 2 Drawing Sheets

100

US 9,420,292 B2

CONTENT ADAPTIVE COMPRESSION SYSTEM

BACKGROUND OF THE INVENTION

1. Field of the Invention

The present invention generally relates to image compression, and more particularly to a content adaptive compression system.

2. Description of Related Art

In order to increase efficiency of storing or transmitting image data, an image is commonly subjected to image compression to reduce irrelevance and redundancy of the image data.

Tremendous compression algorithms have been disclosed. Each compression algorithm may be efficiently suitable for one or a few kinds of image, but there is no universal compression algorithm that may be applicable to all kinds of image. Accordingly, an image to be compressed should be determined beforehand, and an appropriate compression algorithm would be decided and consequently used to encode the image at hand.

This conventional scheme lacks adaptation and immediateness of changing compression algorithm to make it suitable for a new kind of image. Moreover, it is not unusual that an image may ordinarily include many kinds of image contents, and there is no effective way of correctly and promptly deciding which compression algorithm should be adopted.

For the foregoing reasons, a need has arisen to propose a novel compression scheme capable of efficiently and promptly encoding an image.

SUMMARY OF THE INVENTION

In view of the foregoing, it is an object of the embodiment of the present invention to provide a content adaptive compression system that adaptively encodes a portion of an image with an efficient encoder that best suits the content of that portion of the image.

According to one embodiment, a content adaptive compression system includes encoders, an error count unit and a mode decision unit. The encoders receive a portion of an image, and accordingly generate candidate compressed codes, respectively. The encoders are configured for encoding images of different contents. The error count unit determines an amount of error between the image and the candidate compressed code for each of the encoders. The mode decision unit receives a plurality of the amount of error. The candidate compressed code associated with least amount of error is outputted as an adaptive compressed code for the image.

DETAILED DESCRIPTION OF THE INVENTION

Figure 1:
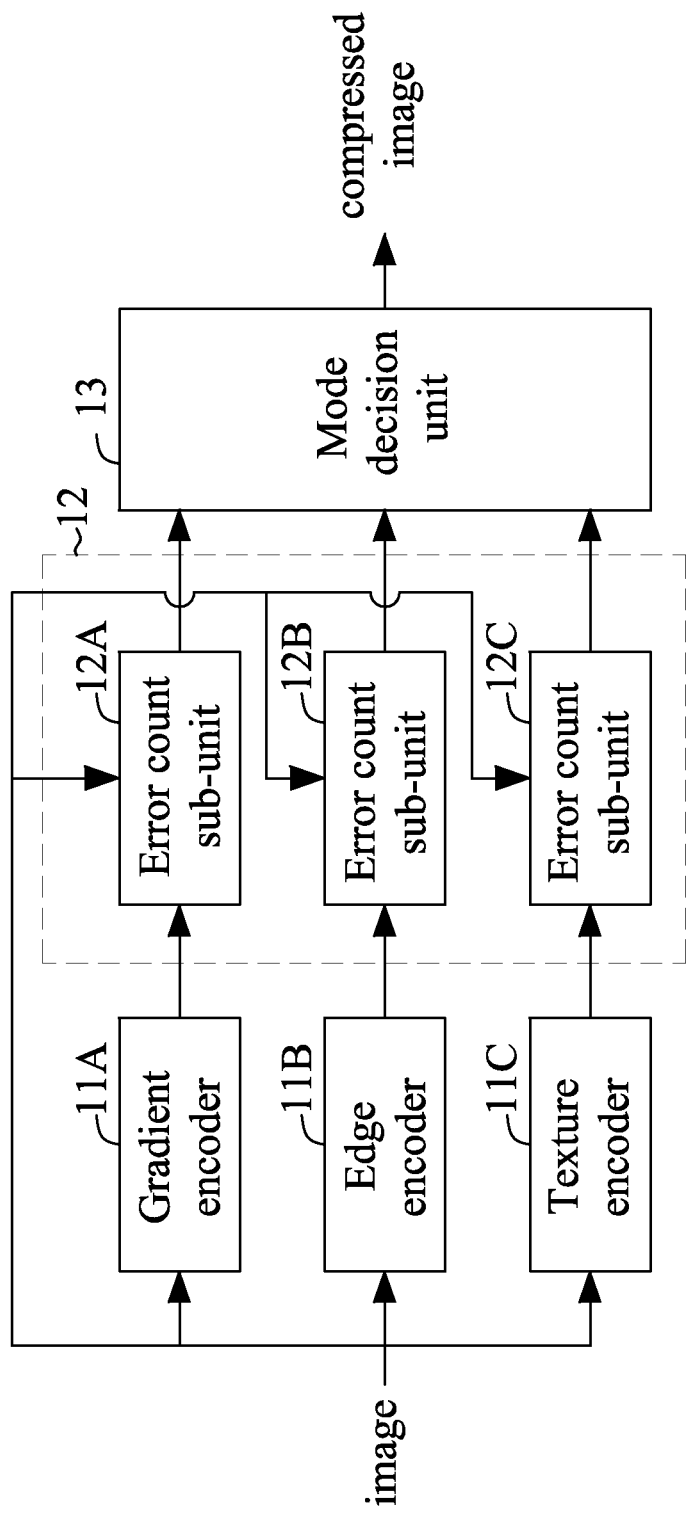
FIG. 1 shows a block diagram illustrated of a content adaptive compression system according to one embodiment of the present invention.

FIG. 1 shows a block diagram illustrated of a content adaptive compression system ("compression system" hereinafter) 100 according to one embodiment of the present invention. The shown blocks of the compression system 100 may be implemented or performed, for example, by circuitry such as a digital image processor. As the code generated from the compression system 100 of the embodiment has a fixed number of bits, the compression system 100 is a fixed length compression system. Moreover, an image to be compressed by the compression system 100 should be first divided into blocks, and one block (e.g., composed of 2×8 pixels) of the image is received and compressed at a time by the compression system 100, which is therefore a block-based compression system.

As shown in FIG. 1, the compression system 100 may include a number of encoders, for example, three encoders 11A, 11B and 11C as exemplified in FIG. 1. The encoders 11A-11C are coupled to receive a block of the image, and accordingly generate candidate compressed codes, respectively. According to one aspect of the embodiment, the encoders 11A-11C are configured for encoding images of different contents, respectively. Specifically, in the embodiment, a gradient encoder 11A is configured for encoding the image of a gradient content, an edge encoder 11B is configured for encoding the image of an edge content, and a texture encoder 11C is configured for encoding the image of a texture content.

The compression system 100 may include an error count unit 12 that is configured to determine an amount of error between the (original) image and the candidate compressed code. In one embodiment, as exemplified in FIG. 1, the error count unit 12 may include three error count sub-units 12A, 12B and 12C for the gradient encoder 11A, the edge encoder 11B and the texture encoder 11C, respectively. In another embodiment, not shown in FIG. 1, a single error count unit 12 may be used for the encoders 11A-11C in sequence.

In the embodiment, sum of absolute differences (SAD) is adopted to determine the amount of error. Specifically, an absolute difference between each pixel in the block of the (original) image and a corresponding pixel in the candidate compressed code is taken. Absolute differences corresponding to at least a portion of pixels in the block of the image are then summed to generate a metric of error. The less is the metric, the less is the error. Accordingly, the error count unit 12 generates metrics for different codings, e.g., gradient coding, edge coding and texture coding.

The compression system 100 of the embodiment may also include a mode decision unit 13 that is coupled to receive the metrics (e.g., SADs) for gradient coding, edge coding and texture coding. The coding associated with the least metric is then determined (by the mode decision unit 13) as an adaptive coding, and the candidate compressed code from the corresponding encoder 11A, 11B or 11C is then used as an adaptive compressed code for the (block of the) image. The adaptive compressed codes of all blocks of the image construct a compressed image, which may be then stored, transmitted or subjected to further processing. The gradient encoder 11A, the edge encoder 11B and the texture encoder 11C mentioned above will be described in details in the following paragraphs.

Figure 2:
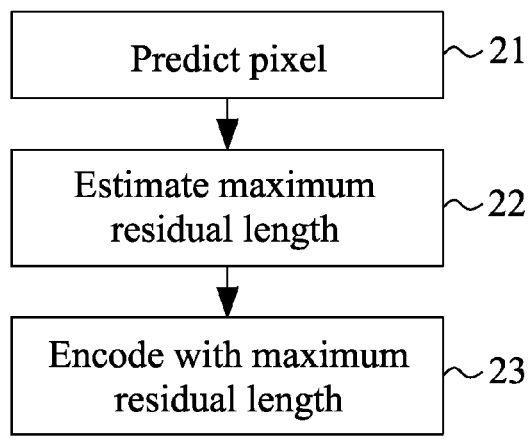
FIG. 2 shows a flow diagram of performing the gradient encoder of FIG. 1 according to the embodiment of the present invention.

FIG. 2 shows a flow diagram of performing the gradient encoder 11A of FIG. 1 according to the embodiment of the present invention. In the embodiment, the gradient coding is performed by bitstream coding algorithm. Although the bitstream coding is exemplified here, however, other algorithms in the conventional art suitable for coding a gradient content may be used instead. Specifically, in step 21, a pixel is predicted according to neighboring pixels. In the embodiment, a median adaptive prediction is adopted to carry out pixel prediction according to an upper pixel and a left pixel. In step 22, a maximum residual length is estimated for some different conditions, such as RGB color space, YUV color space, lossless coding or lossy coding. In step 23, components (e.g., R, G and B) of the pixel are then encoded, for example, using bitstream coding algorithm, with the maximum residual length determined in step 22.

Figure 3:
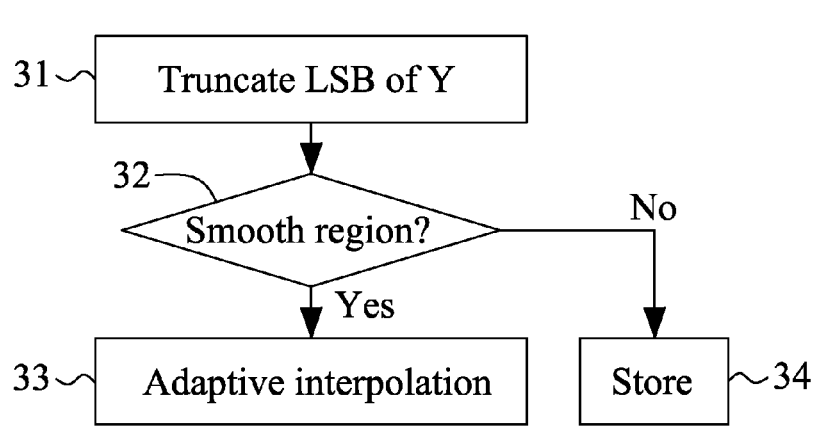
FIG. 3 shows a flow diagram of performing the edge encoder of FIG. 1 according to the embodiment of the present invention.

FIG. 3 shows a flow diagram of performing the edge encoder 11B of FIG. 1 according to the embodiment of the present invention. In the embodiment, the edge coding is performed, for example, in YUV color space. Although the YUV color space is used here, however, other color spaces in the conventional art suitable for coding an edge content may be used instead. Specifically, in step 31, the least significant bit (LSB) of a luminance component Y is truncated. Step 32 is performed to determine whether a smooth region exists. If it is determined to be a smooth region, adaptive interpolation is adopted to encode the pixels (step 33); otherwise, the pixels are stored directly (step 34). In one embodiment, the smoothness may be determined by comparing the block of image with a block shifted with one pixel. If the difference (e.g., SAD) between the two blocks is less than a predetermined threshold, a smooth region is thus determined.

Figure 4:
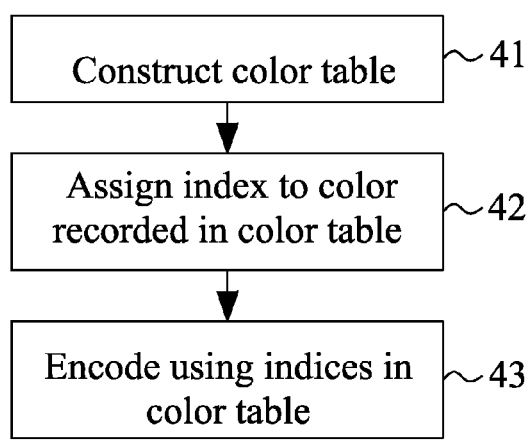
FIG. 4 shows a flow diagram of performing the texture encoder of FIG. 1 according to the embodiment of the present invention.

FIG. 4 shows a flow diagram of performing the texture encoder 11C of FIG. 1 according to the embodiment of the present invention. In the embodiment, the texture coding is performed by block truncation coding (BTC). Although the block truncation coding is exemplified here, however, other algorithms in the conventional art suitable for coding a texture content may be used instead. Specifically, in step 41, a color table is constructed for the block of image to be encoded. The color table records some dominating colors, such as a color with the maximum intensity, a color with the minimum intensity, and at least one color with an intermediate intensity. In one embodiment, the color table is constructed progressively. Specifically speaking, a first sub-block (e.g., composed of 2×2 pixels) and a second sub-block are compared to record dominating colors in the color table. Next, a third sub-clock is inspected, and further dominating colors may be determined to update the color table. The color table is updated progressively until the final sub-block has been inspected.

Subsequently, in step 42, indices are respectively assigned to the colors recorded in the color table. In step 43, the pixels in the block of image are then encoded using the indices in the color table. Accordingly, the number of levels in each block of image may be reduced (or quantized) while maintaining the same mean and standard deviation.

Although specific embodiments have been illustrated and described, it will be appreciated by those skilled in the art that various modifications may be made without departing from the scope of the present invention, which is intended to be limited solely by the appended claims.

What is claimed is:

1. A content adaptive compression system, comprising:
a plurality of encoders being coupled to receive a portion of an image, and accordingly generating candidate compressed codes, respectively, the plurality of encoders being configured for encoding images of different contents;
an error count unit configured to determine an amount of error between the image and the candidate compressed code for each of the encoders; and
a mode decision unit coupled to receive a plurality of the amount of error, the candidate compressed code associated with least amount of error being outputted as an adaptive compressed code for the image.

2. The system of claim 1, wherein the image is divided into blocks, one of which being received by the plurality of encoders at a time.

3. The system of claim 1, wherein the error count unit comprises a plurality of error count sub-units associated with the plurality of encoders.

4. The system of claim 1, wherein the amount of error is determined according to sum of absolute differences between pixels of the image and corresponding pixels in the candidate compressed code.

5. The system of claim 1, wherein the plurality of encoders comprise a gradient encoder configured for encoding the image of a gradient content, an edge encoder configured for encoding the image of an edge content, and a texture encoder configured for encoding the image of a texture content.

6. The system of claim 5, wherein the gradient encoder performs the following steps:
predicting a pixel according to neighboring pixels;
estimating a maximum residual length; and
encoding components of the pixel with the maximum residual length.

7. The system of claim 6, wherein the pixel is predicted by a median adaptive prediction according to an upper pixel and a left pixel.

8. The system of claim 6, wherein the components of the pixel are encoded using bitstream coding algorithm.

9. The system of claim 5, wherein the edge encoder performs the following steps:
truncating a least significant bit of a luminance component of a pixel;
determining whether a smooth region exists in the image;
adopting adaptive interpolation to encode the image if the smooth region is determined; and
directly storing the image if the smooth region is not determined.

10. The system of claim 9, wherein the smooth region is determined by comparing the image with an image shifted with one pixel.

11. The system of claim 5, wherein the texture encoder performs the following steps:
constructing a color table for the image, the color table recording a plurality of dominating colors;
respectively assigning indices to the plurality of dominating colors; and
encoding pixels of the image using the indices.

12. The system of claim 11, wherein the plurality of dominating colors comprise a color with a maximum intensity, a color with a minimum intensity, and at least one color with an intermediate intensity between the maximum intensity and the minimum intensity.

13. The system of claim 5, wherein the texture encoder is performed by block truncation coding.

* * * * *